United States Patent
Kawai et al.

(10) Patent No.: US 11,600,772 B2
(45) Date of Patent: Mar. 7, 2023

(54) RESISTANCE VARIABLE DEVICE WITH CHALCOGEN-CONTAINING LAYER

(71) Applicant: Kioxia Corporation, Tokyo (JP)

(72) Inventors: Hiroki Kawai, Inazawa Aichi (JP); Katsuyoshi Komatsu, Yokkaichi Mie (JP); Tadaomi Daibou, Yokkaichi Mie (JP); Hiroki Tokuhira, Kawasaki Kanagawa (JP); Masatoshi Yoshikawa, Yokkaichi Mie (JP); Yuichi Ito, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 115 days.

(21) Appl. No.: 17/014,587

(22) Filed: Sep. 8, 2020

(65) Prior Publication Data
US 2021/0202838 A1 Jul. 1, 2021

(30) Foreign Application Priority Data
Dec. 25, 2019 (JP) .............................. JP2019-235257

(51) Int. Cl.
H01L 45/00 (2006.01)
(52) U.S. Cl.
CPC ........ *H01L 45/1253* (2013.01); *H01L 45/143* (2013.01); *H01L 45/144* (2013.01)
(58) Field of Classification Search
CPC . H01L 45/1253; H01L 45/143; H01L 45/144; H01L 27/224; H01L 45/10; H01L 45/1233; H01L 27/2427; H01L 45/141
See application file for complete search history.

(56) References Cited

U.S. PATENT DOCUMENTS

| | | | |
|---|---|---|---|
| 9,543,512 | B2 | 1/2017 | Ohba |
| 10,084,017 | B2 | 9/2018 | Ohba |
| 2006/0203430 | A1 | 9/2006 | Pinnow |
| 2017/0294375 | A1* | 10/2017 | Terada ................... H01L 27/222 |
| 2018/0019281 | A1 | 1/2018 | Lee |
| 2018/0033826 | A1* | 2/2018 | Choi ................... G11C 13/0004 |
| 2018/0198064 | A1 | 7/2018 | Chiang |
| 2019/0006586 | A1 | 1/2019 | Maes |

(Continued)

OTHER PUBLICATIONS

Zheng Y., et al. Direct atomic identification of cation migration induced gradual cubic-to-hexagonal phase transition in Ge2Sb2Te5. Communications Chemistry, (2019) 2:13 (Year: 2019).*

*Primary Examiner* — Jerome Leboeuf
(74) *Attorney, Agent, or Firm* — Foley & Lardner LLP

(57) ABSTRACT

A resistance variable device of an embodiment includes a stack arranged between a first electrode and a second electrode and including a resistance variable layer and a chalcogen-containing layer. The chalcogen-containing layer contains a material having a composition represented by a general formula: $C1_xC2_yA_z$, where C1 is at least one element selected from Sc, Y, Zr, and Hf, C2 is at least one element selected from C, Si, Ge, B, Al, Ga, and In, A is at least one element selected from S, Se, and Te, and x, y, and z are numbers representing atomic ratios satisfying $0<x<1$, $0<y<1$, $0<z<1$, and $x+y+z=1$, and when an oxidation number of the element C1 is set to a, and an oxidation number of the element C2 is set to b, the atomic ratio x of the element C1 satisfies $x \leq (3-(3+b) \times y-z)/(3+a)$.

17 Claims, 4 Drawing Sheets

(56) References Cited

U.S. PATENT DOCUMENTS

| 2019/0252609 A1 | 8/2019 | Sei |
| 2020/0066986 A1* | 2/2020 | Fantini ..................... G11C 7/18 |
| 2021/0050512 A1* | 2/2021 | Fugazza ................. H01L 45/16 |
| 2021/0134361 A1* | 5/2021 | Wu ...................... G11C 13/004 |

* cited by examiner

RESISTANCE VARIABLE DEVICE WITH CHALCOGEN-CONTAINING LAYER

CROSS REFERENCE TO RELATED APPLICATION

This application is based upon and claims the benefit of priority from Japanese Patent Application No. 2019-235257, filed on Dec. 25, 2019; the entire contents of which are incorporated herein by reference.

FIELD

Embodiments disclosed herein relate to a resistance variable device.

BACKGROUND

A resistance variable device having a switch layer and a resistance variable layer as a nonvolatile memory layer, is used for a storage device. In such a resistance variable device, it is demanded to lower a threshold voltage (Vth) at which the switch layer transits from an off-state where a resistance value is high to an on-state where the resistance value is low, without impairing thermal stability of the switch layer.

SUMMARY

A resistance variable device of an embodiment includes: a first electrode; a second electrode; and a stack arranged between the first electrode and the second electrode and including a resistance variable layer and a chalcogen-containing layer, in which the chalcogen-containing layer contains a material having a composition represented by a general formula: $C1_xC2_yA_z$, where C1 is at least one element selected from the group consisting of Sc, Y, Zr, and Hf, C2 is at least one element selected from the group consisting of C, Si, Ge, B, Al, Ga, and In, A is at least one element selected from the group consisting of S, Se, and Te, and x, y, and z are numbers representing atomic fractions satisfying $0<x<1$, $0<y<1$, $0<z<1$, and $x+y+z=1$, and when an oxidation number of the element C1 is set to a, and an oxidation number of the element C2 is set to b, the atomic fraction x of the element C1 satisfies $x \le (3-(3+b) \times y - z)/(3+a)$.

DETAILED DESCRIPTION

Figure 1:
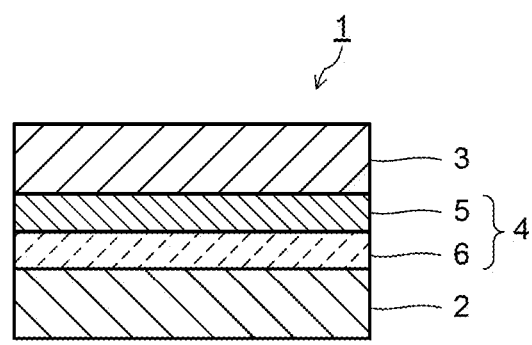
FIG. 1 is a sectional view illustrating a basic configuration of a resistance variable device of an embodiment.

Hereinafter, a resistance variable device of an embodiment will be described while referring to the drawings. In respective embodiments, substantially the same constituent portions are denoted by the same reference numerals, and explanation thereof is sometimes partially omitted. The drawings are schematic, and the relation of thickness and planer dimension, a thickness ratio of the respective parts, and so on may be different from actual ones.

Figure 2:
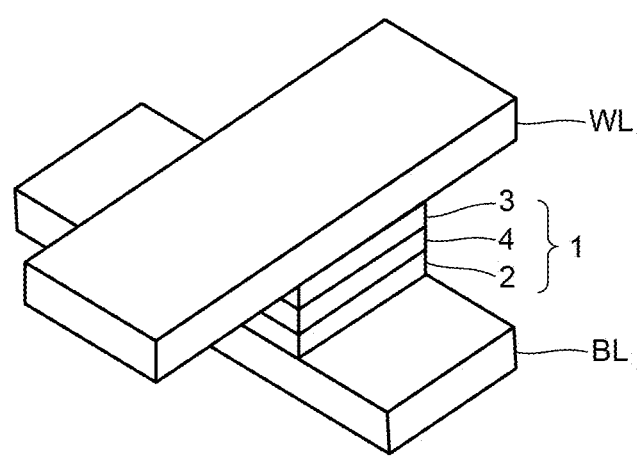
FIG. 2 is a perspective view illustrating a basic configuration of the resistance variable device of the embodiment.

FIG. 1 is a sectional view illustrating a basic configuration of a resistance variable device 1 of an embodiment, and FIG. 2 is a perspective view illustrating a basic configuration of the resistance variable device 1 of the embodiment. The resistance variable device 1 illustrated in FIG. 1 and FIG. 2 includes a first electrode 2, a second electrode 3, and a stack 4 arranged between the first electrode 2 and the second electrode 3. The stack 4 has a resistance variable layer 5 which functions as a nonvolatile memory layer, and a chalcogen-containing layer (chalcogenide layer) 6 which functions as a switch layer. As illustrated in FIG. 2, the resistance variable device 1 is arranged at an intersection point between a bit line BL and a word line WL, to thereby function as a memory cell. Although FIG. 2 illustrates only the intersection point between one bit line BL and one word line WL, actually, the resistance variable devices 1 as memory cells are arranged at respective intersection points between a large number of bit lines BL and word lines WL, to thereby configure a semiconductor memory device.

For the resistance variable layer 5, a memory layer in a conventionally well-known resistance variable type memory is used. As the resistance variable type memory, a resistive random access memory (ReRAM), a phase change memory (PCM), a magnetoresistive random access memory (MRAM), and so on are known. A memory layer in each of these various resistance variable type memories is used as the resistance variable layer 5. The resistance variable layer 5 is not limited to have a single-layer structure, and it may also be a multilayer film required for making functions of respective memories to be exhibited. For each of the first and second electrodes 2, 3, a metal electrode made of, for example, Cu, a Cu alloy, Al, an Al alloy, or the like, is used. Various additional layers may also be arranged between the first electrode 2 and the stack 4, between the second electrode 3 and the stack 4, and between the resistance variable layer 5 and the chalcogen-containing layer 6.

The chalcogen-containing layer 6 that functions as a switch layer (switch element) is electrically connected to the resistance variable layer 5, and has a function of switching on/off of a current with respect to the resistance variable layer 5 (switch function/switch operation). The chalcogen-containing layer 6 has an electric property such that when a threshold voltage (Vth) or more is applied thereto, it rapidly transits from an off-state with relatively high resistance to an on-state of relatively low resistance. Specifically, when the voltage which is applied to the chalcogen-containing layer 6 is lower than the threshold voltage (Vth), the chalcogen-containing layer 6 functions as an insulator, and it interrupts a current that flows through the resistance variable layer 5, to thereby make the resistance variable layer 5 turn into an off-state. When the voltage applied to the chalcogen-containing layer 6 becomes equal to or more than the threshold voltage (Vth), the resistance value of the chalcogen-containing layer 6 is rapidly lowered and the chalcogen-containing layer 6 functions as an electric conductor, resulting in that the current starts to flow through the resistance variable layer 5 via the chalcogen-containing layer 6, which makes the resistance variable layer 5 turn into an on-state. The variation in the resistance value based on the applied voltage with respect to the chalcogen-containing layer 6, occurs rapidly in a reversible manner.

The chalcogen-containing layer 6 that functions as the switch layer is a compound containing at least one element C1 selected from the group consisting of scandium (Sc), yttrium (Y), zirconium (Zr), and hafnium (Hf), at least one element C2 selected from the group consisting of carbon (C), silicon (Si), germanium (Ge), boron (B), aluminum (Al), gallium (Ga), and indium (In), and at least one element A selected from the group consisting of sulfur (S), selenium (Se), and tellurium (Te) (also referred to as a first layer composing material, hereinafter). The chalcogen-containing layer 6 may also further contains nitrogen (N), in addition to the element C1, the element C2, and the element A (also referred to as a second layer composing material, hereinafter).

The first layer composing material of the chalcogen-containing layer 6 can have a composition represented by the following composition formula (1), for example.

$$a\ general\ formula:\ C1_xC2_yA_z \qquad (1),$$

where x, y, and z are numbers representing atomic ratios satisfying $0<x<1$, $0<y<1$, $0<z<1$, and $x+y+z=1$.

The second layer composing material of the chalcogen-containing layer 6 can have a composition represented by the following composition formula (2), for example.

$$a\ general\ formula:\ C1_xC2_yA_zN_w \qquad (2),$$

where x, y, z, and w are numbers representing atomic ratios satisfying $0<x<1$, $0<y<1$, $0<z<1$, $0<w<1$, and $x+y+z+w=1$.

Each of the first layer composing material and the second layer composing material of the chalcogen-containing layer 6 may also be a compound containing at least one element C11 selected from the group consisting of Sc and Y, at least one element C2 selected from the group consisting of C, Si, Ge, B, Al, Ga, and In, and at least one element A selected from the group consisting of S, Se, and Te. The above-described material may further contain at least one element C12 selected from the group consisting of Zr and Hf, and may also contain N. In these cases, the first layer composing material can have a composition represented by the following composition formula (3), and the second layer composing material can have a composition represented by the following composition formula (4).

$$A\ general\ formula:\ C11_{x1}C12_{x2}C2_yA_z \qquad (3),$$

where x1, x2, y, and z are numbers representing atomic fractions satisfying $0<x1<1$, $0≤x2<1$, $0<y<1$, $0<z<1$, and $x1+x2+y+z=1$.

$$A\ general\ formula:\ C11_{x1}C12_{x2}C2_yA_zN_w \qquad (4),$$

where x2, y, z, and w are numbers representing atomic fractions satisfying $0<x1<1$, $0≤x2<1$, $0<y<1$, $0<z<1$, $0<w<1$, and $x1+x2+y+z+w=1$.

The function as the switch layer described above, can be obtained by a material containing at least one element A selected from the group consisting of S, Se, and Te (chalcogen element). The material containing the element A composing the chalcogen-containing layer 6 preferably has an amorphous structure. In order to obtain the above-described switch characteristic, the chalcogen-containing layer 6 is preferably an amorphous semiconductor having a large number of localized states in a band gap.

The element A is an element to be an anion, and an element that contributes to not only stabilization of the amorphous structure but also formation of trap level, and based on these, the switch operation can be exhibited. Specifically, with the use of the chalcogen-containing layer 6, it is possible to obtain a function of transiting between a high-resistance state and a low-resistance state (switch function) based on the threshold voltage (Vth). The switch function is derived from an electric conduction mechanism via the localized states in the band gap ascribable to the amorphous structure. The element A is preferably contained by 10 atom % or more in the first layer composing material or the second layer composing material, in order to obtain the switch function.

In order to obtain the amorphous structure, the chalcogen-containing layer 6 may contain N. N is an element to be an anion, similarly to the element A. The chalcogen-containing layer 6 containing N improves the thermal stability (glass transition temperature), and further contributes to the formation of the amorphous structure. Further, it is possible to reduce a leakage current. However, when N is excessively contained, there is a concern that deterioration of film properties is caused by desorption of N as N2, or the chalcogen-containing layer 6 is turned into an insulator due to increase of the band gap. For this reason, the content of N is preferably set within the range of appropriate values. A concrete composition ratio (atomic fraction) will be described later.

Each of the first and second layer composing materials of the chalcogen-containing layer 6 contains, in addition to the element A to be an anion and N which is contained according to need, the element C1 and the element C2 as elements to be cations. The element C2 is an element that increases a mean coordination number (MCN) of the first and second layer composing materials, to thereby stabilize the amorphous state. GeTe, SiTe, BTe, GeSe, and so on are known as materials exhibiting the switch function, and thus the material containing the element C2 and the element A can be considered to similarly exhibit the switch function. In order to obtain the switch function based on the stabilization of the amorphous state, the element C2 is preferably contained, by 10 atom % or more, in the first layer composing material or the second layer composing material. However, when the content of the element C2 is excessively large, there is a possibility that the first and second layer composing materials are crystallized, resulting in that the switch function cannot be obtained in some cases.

Figure 3:
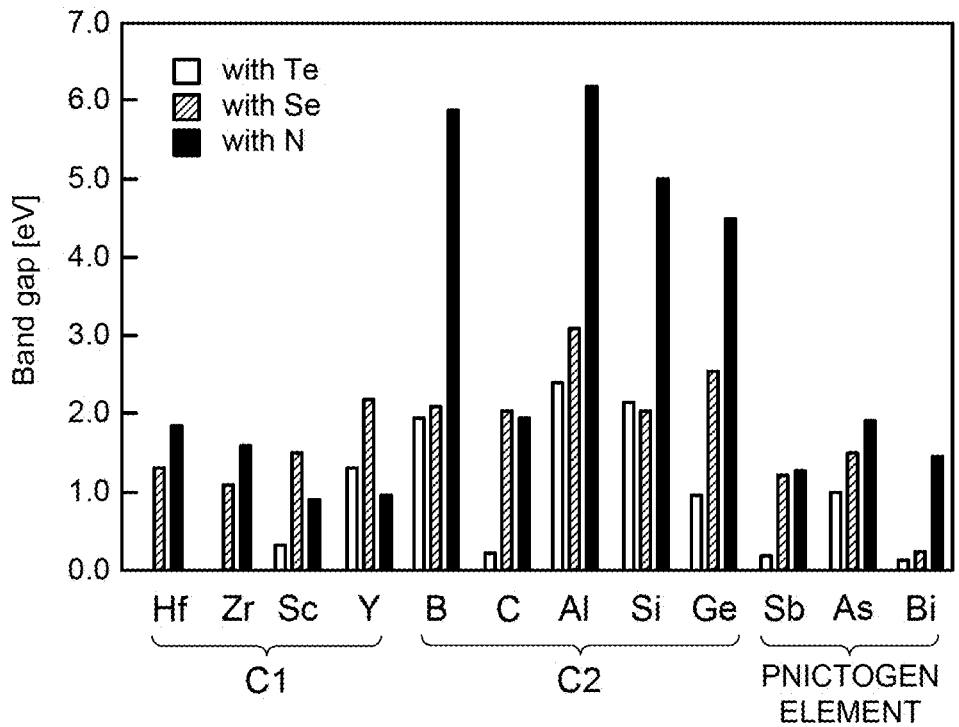
FIG. 3 is a view illustrating band gaps of tellurides, selenides, and nitrides of elements C1 and elements C2 in a chalcogen-containing layer of the resistance variable device of the embodiment.

Each of the first and second layer composing materials contains, in addition to the element C2 as described above, at least one element C1 selected from the group consisting of Sc, Y, Zr, and Hf. FIG. 3 illustrates band gaps (Eg) of tellurides, selenides, and nitrides of elements C1, elements C2, and pnictogen elements (Sb, As, Bi) for comparison. As illustrated in FIG. 3, the band gaps (Eg) of the tellurides, the selenides, and the nitrides of the elements C1 are smaller than those of the elements C2, so that the first and second layer composing materials are not likely to become insulators. Besides, the band gaps (Eg) of the tellurides, the selenides, and the nitrides of the elements C1 are nearly equal to those of the pnictogen elements (Sb, As, Bi) for comparison, and thus the elements C1 are expected to contribute to the reduction in the threshold voltage (Vth), similarly to the pnictogen elements for comparison.

Figure 4:
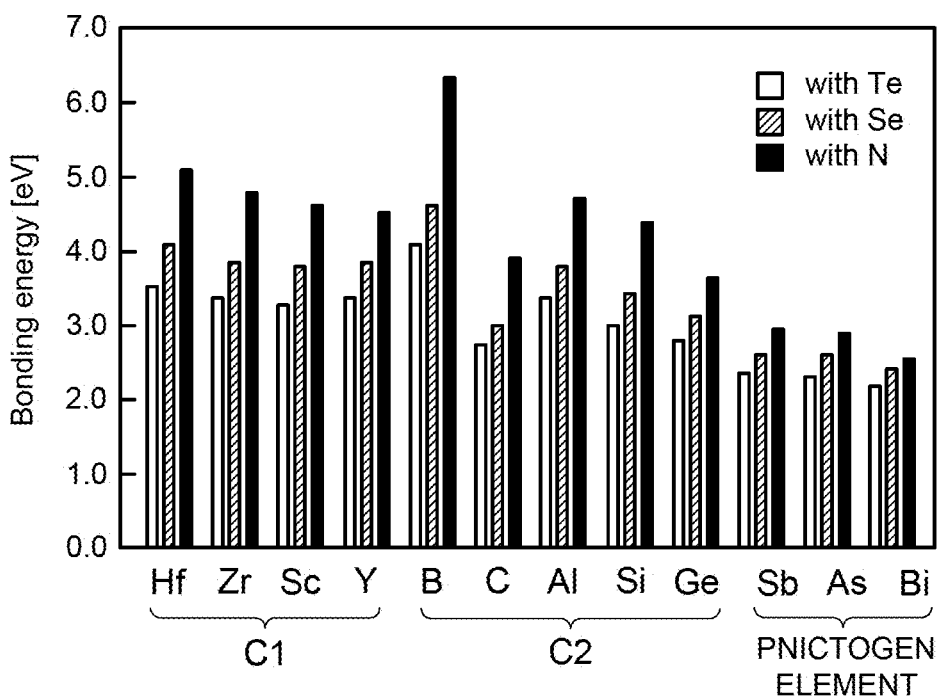
FIG. 4 is a view illustrating bonding energies between the elements C1 and the elements C2 in the chalcogen-containing layer of the resistance variable device of the embodiment, and Te, Se, and N.

FIG. 4 illustrates bonding energies between the elements C1, the elements C2, and the pnictogen elements (Sb, As, Bi) for comparison, and Te, Se, and N. As illustrated in FIG. 4, the pnictogen elements (Sb, As, Bi) for comparison have small bonding energies with Te, Se, and N. It can be understood that when such pnictogen elements are added, the glass transition temperature of the switch layer is decreased, worsening the thermal stability. On the contrary, it can be understood that the elements C1 have the bonding energies with Te, Se, and N, which are nearly equal to those of the elements C2. Therefore, with the use of the first and second layer composing materials containing the element C1, the glass transition temperature is increased, and it improves the thermal stability of the chalcogen-containing layer 6 as the switch layer and also the resistance variable device 1 as the result.

Whether each of the above-described first and second layer composing materials has the property of transiting between the high-resistance state and the low-resistance state (switch characteristic) on the threshold voltage (Vth), can be judged from the band gaps (Eg) of tellurides, selenides, and sulfides of the elements C1 and the elements C2, for example. As illustrated in FIG. 4, each of the tellurides, the selenides, and the like of the elements C1 and the elements C2 has a band gap (Eg) within a proper range. Based on such a band gap (Eg), it is possible to judge that the chalcogen-containing layer 6 made of each of the first and second layer composing materials has the above-described switch characteristic.

Figure 5:
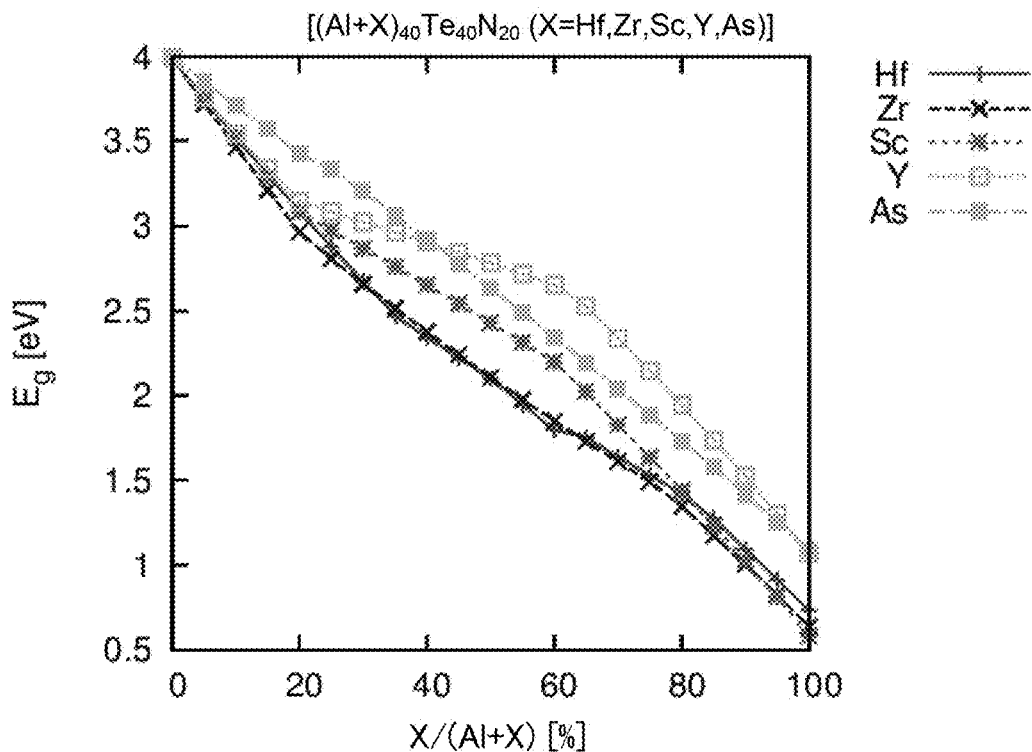
FIG. 5 is a view illustrating a relation between an substitution ratio of the element C1 in one configuration example of the chalcogen-containing layer of the resistance variable device of the embodiment, and a band gap (Eg).
Figure 6:
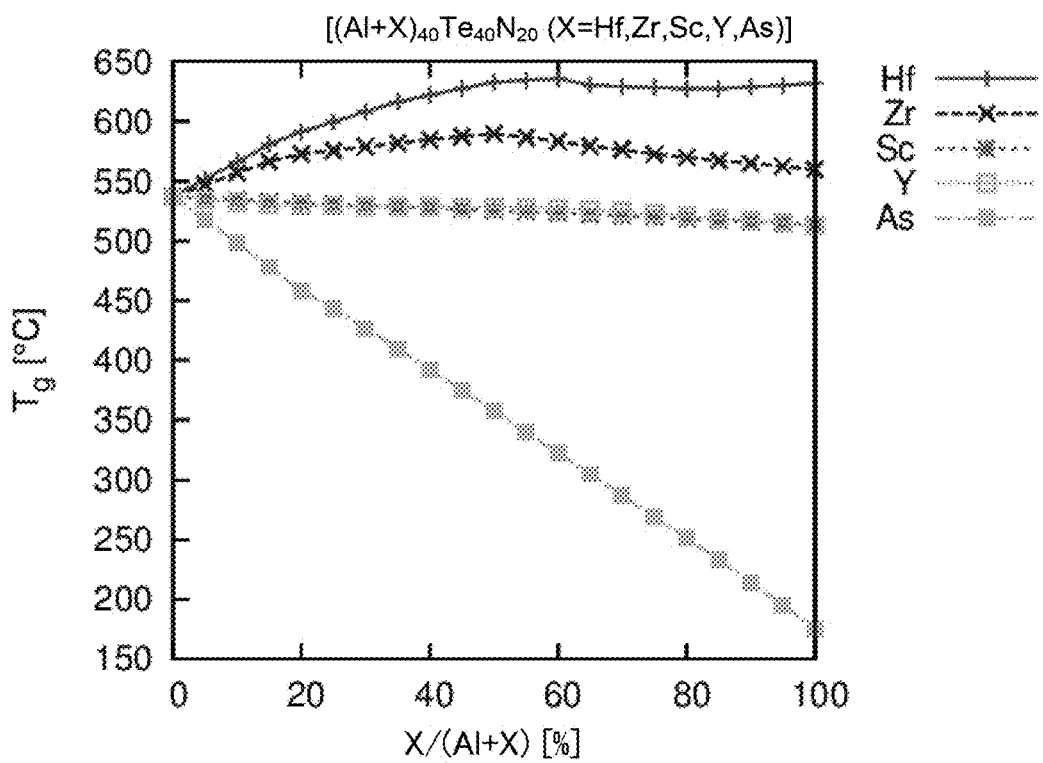
FIG. 6 is a view illustrating a relation between an substitution ratio of the element C1 in one configuration example of the chalcogen-containing layer of the resistance variable device of the embodiment, and a glass transition temperature (Tg).
Figure 7:
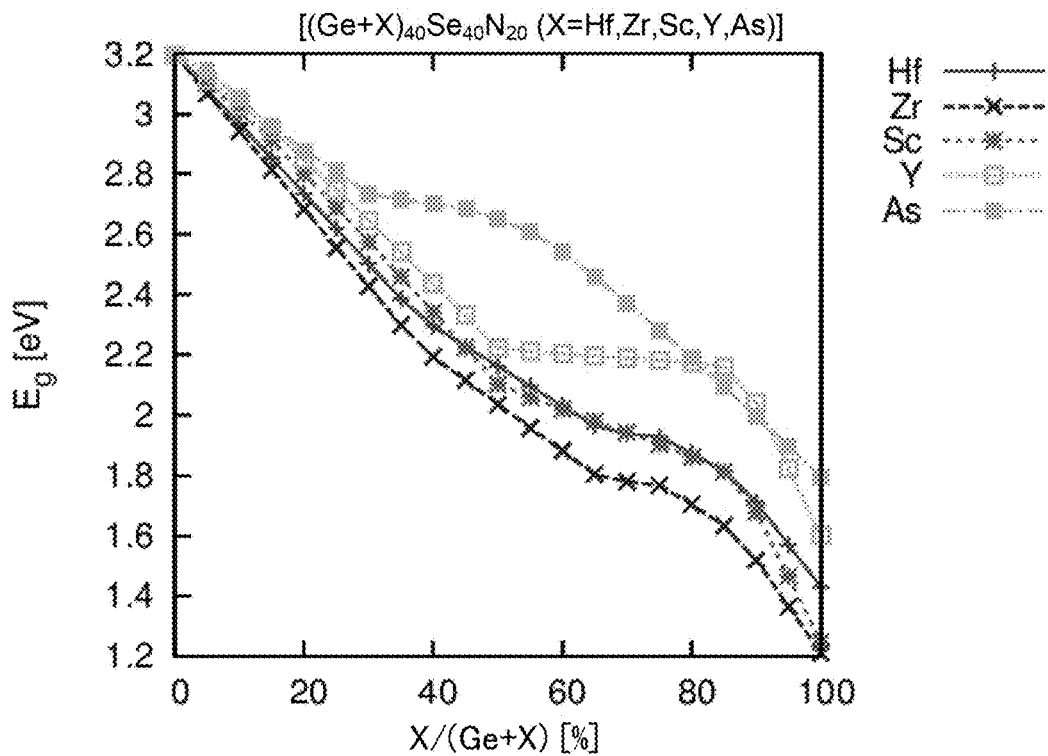
FIG. 7 is a view illustrating a relation between an substitution ratio of the element C1 in another configuration example of the chalcogen-containing layer of the resistance variable device of the embodiment, and a band gap (Eg).
Figure 8:
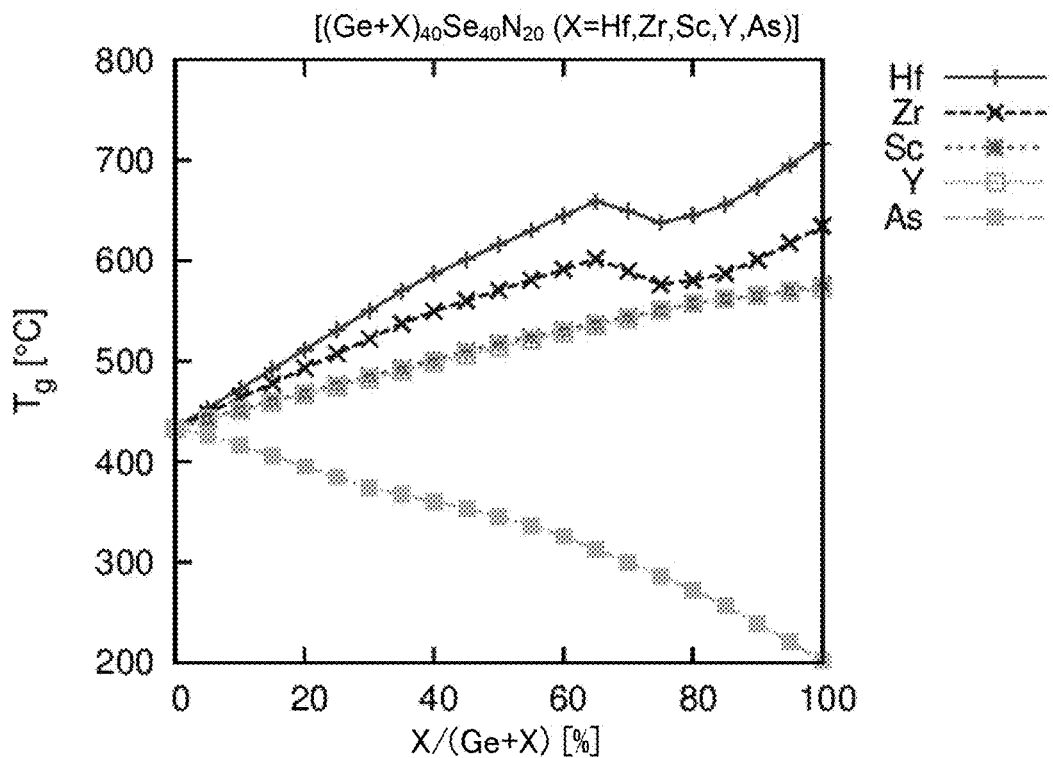
FIG. 8 is a view illustrating a relation between an substitution ratio of the element C1 in another configuration example of the chalcogen-containing layer of the resistance variable device of the embodiment, and a glass transition temperature (Tg).

As described above, with the use of the resistance variable device 1 that uses the chalcogen-containing layer 6 containing the element C1, as the switch layer, it is possible to improve the thermal stability. Besides, it is possible to reduce the threshold voltage (Vth) of the switch layer. The thermal stability and the threshold voltage (Vth) of the chalcogenide layer 6 will be further explained by FIG. 5, FIG. 6, FIG. 7, and FIG. 8. FIG. 5 and FIG. 6 illustrate a band gap (Eg) (FIG. 5) and a glass transition temperature (Tg) (FIG. 6) when an substitution ratio of X (X/(Al+X)) is changed in an $(Al+X)_{40}Te_{40}N_{20}$ compound (X=Hf, Zr, Sc, Y, As). FIG. 7 and FIG. 8 illustrate a band gap (Eg) (FIG. 7) and a glass transition temperature (Tg) (FIG. 8) when an substitution ratio of X(X/(Ge+X)) is changed in a $(Ge+X)_{40}Se_{40}N_{20}$ compound (X=Hf, Zr, Sc, Y, As).

As illustrated in FIG. 5 and FIG. 7, when the substitution ratio of the element C1 is increased in the material containing the element C2, the element A, and N, the band gap (Eg) is lowered, similarly to As being the pnictogen element for comparison. It can be expected that the threshold voltage (Vth) is lowered as the band gap (Eg) becomes smaller. Therefore, with the use of the materials each containing the element C1, the element C2, and the element A, and the materials obtained by further adding N to the aforementioned materials, it is possible to lower the threshold voltage (Vth). Further, as illustrated in FIG. 6 and FIG. 8, the glass transition temperature (Tg) is lowered by increasing the substitution ratio of As, which is the pnictogen element for comparison. On the contrary, even if the substitution ratio of the element C1 is increased, the glass transition temperature (Tg) is not lowered, and in some case, the grass transition temperature (Tg) is increased. Therefore, by using the materials containing the element C1, the element C2, and the element A, and the materials obtained by further adding N to the aforementioned materials, it is possible to improve the thermal stability. In summary, by using the material including the element C1, it is possible to lower the threshold voltage (Vth) while maintaining the thermal stability. However, in order to improve the amorphization of the material, a part of the element C1 may be replaced with at least one element selected from the group consisting of Sb, As, and Bi.

Next, a composition ratio (atomic fraction) of the first and second layers composing materials will be described. As described above, the element C1 and the element C2 are elements to be cations, the oxidation number of Sc and Y is three (+3), the oxidation number of Hf and Zr is four (+4), the oxidation number of C, Si, and Ge is four (+4), and the oxidation number of B, Al, Ga, and In is three (+3). The element A and N are elements to be anions, the oxidation number of S, Se, and Te is two (−2), and the oxidation number of N is three (−3). In a material containing these elements, when a total oxidation number of cations exceeds a total oxidation number of anions, there is a concern that the cations remain as metallic states, which increases a leakage current of the chalcogen-containing layer 6 as the switch layer. Therefore, it is preferable to decide the composition ratio (atomic fraction) so that the total valence of the cations being the element C1 and the element C2, does not exceed the total valence of the anions being the element A and N.

When the oxidation number and the atomic fraction of the metal cation C1 are set to a and x, respectively, the oxidation number and the atomic fraction of the metal cation C2 are set to b and y, respectively, the atomic fraction of the anion A is set to z, and the atomic fraction of N is set to w, it is preferable that a condition represented by the following formula (5) is satisfied, in order to satisfy the atomic fractions of the cations and the anions described above.

$$a \times x + b \times y \leq 2 \times z + 3 \times w \quad (5)$$

When the aforementioned formula (5) is arranged, the following formula (6) is created. Therefore, the atomic fraction x of the element C1 in the first and second layer composing materials preferably satisfies the following formula (6).

$$x \leq (3-(3+b) \times y-z)/(3+a) \quad (6)$$

As described above, the atomic fraction y of the element C2 is preferably set to 0.1 or more, and the atomic fraction z of the element A is preferably set to 0.1 or more. When these atomic fractions (y=0.1, z=0.1) are taken into consideration, a condition in which the leakage current of the chalcogen-containing layer 6 as the switch layer is likely to be increased, is represented by the following formula (7).

$$x > (2.6-0.1b)/(3+a) = x_{max} \quad (7)$$

When Sc and Y of the oxidation number +3 are used as the elements C1, and the elements C2 are C, Si, and Ge of the oxidation number +4, the value of $x_{max}$ in the aforementioned formula (7) becomes 0.367, and when the elements C2 are B, Al, Ga, and In of the oxidation number +3, $x_{max}$ becomes 0.383. Therefore, when the element C1 includes at least one of Sc and Y, even if the element C2 is any element selected from C, Si, Ge, B, Al, Ga, and In, the atomic fraction x of the element C1 is preferably set to 0.01 or more and 0.38 or less, based on the larger value of $x_{max}$ described above (0.383). The lower limit value of 0.01 is a value for effectively obtaining an improvement effect of the thermal stability and the like by doping the element C1 that includes at least one of Sc and Y.

When Hf and Zr of +4 are used as the elements C1, and the elements C2 are C, Si, and Ge of the oxidation number +4, the value of $x_{max}$ in the aforementioned formula (7) becomes 0.314, and when the elements C2 are B, Al, Ga, and In of the oxidation number +3, xmax becomes 0.329. Therefore, when the element C1 includes at least one of Hf and Zr, even if the element C2 is any element selected from C, Si, Ge, B, Al, Ga, and In, the atomic fraction x of the element C1 is preferably set to 0.01 or more and 0.32 or less, based on the larger value of xmax described above (0.329). The lower limit value of 0.01 is a value for effectively obtaining the improvement effect of the thermal stability and the like by doping the element C1 that includes at least one of Hf and Zr.

In the case where the chalcogen-containing layer 6 as the switch layer contains N, when N is excessively contained, there is a concern that deterioration of film properties is caused by desorption of N as N2, or the chalcogen-containing layer 6 is turned into an insulator since the band gap is increased, as described above. With respect to this point, there is a concern that when a total bonding number of nitrogen exceeds a value represented by [(bonding number of cation)— (bonding number of chalcogen (element A))], bonding of N and N is formed by N atoms which cannot be bonded to cations, resulting in desorption of N2 molecules. Therefore, the atomic fraction w of N preferably satisfies a condition represented by the following formula (8).

$$3 \times w \leq a \times x + b \times y - 2 \times z \quad (8)$$

When the aforementioned formula (8) is arranged, the following formula (9) is created. Therefore, the atomic fraction w of N in the second layer composing material preferably satisfies the following formula (9).

$$w \leq (a-(a-b) \times y - (a+2) \times z)/(3+a) \quad (9)$$

When the atomic fraction of the element C2 and the atomic fraction of the element A described above (y=0.1, z=0.1) are taken into consideration, a condition in which the N2 molecules are likely to escape from the chalcogen-containing layer 6 as the switch layer, is represented by the following formula (10).

$$w > (0.8 \times a + 0.1 \times b - 0.2)/(3+a) = w_{max} \quad (10)$$

When Sc and Y of the oxidation number +3 are used as the elements C1, and the elements C2 are C, Si, and Ge of the oxidation number +4, the value of $w_{max}$ in the aforementioned formula (10) becomes 0.433, and when the elements C2 are B, Al, Ga, and In of the oxidation number +3, $w_{max}$ becomes 0.417. Therefore, when the element C1 includes at least one of Sc and Y, even if the element C2 is any element selected from C, Si, Ge, B, Al, Ga, and In, the atomic fraction w of N is preferably set to 0.01 or more and 0.43 or less, based on the larger value of $w_{max}$ described above (0.433). The lower limit value of 0.01 is a value for effectively obtaining the improvement effect of the thermal stability and the like by doping N.

When Hf and Zr of the oxidation number +4 are used as the elements C1, and the elements C2 are C, Si, and Ge of the oxidation number +4, the value of $w_{max}$ in the aforementioned formula (10) becomes 0.486, and when the elements C2 are B, Al, Ga, and In of the oxidation number +3, $w_{max}$ becomes 0.471. Therefore, when the element C1 includes at least one of Hf and Zr, even if the element C2 is any element selected from C, Si, Ge, B, Al, Ga, and In, the atomic fraction w of N is preferably set to 0.01 or more and 0.48 or less, based on the larger value of wmax described above (0.486). The lower limit value of 0.01 is a value for effectively obtaining the improvement effect of the thermal stability and the like by doping N.

As described above, when the chalcogen-containing layer 6 as the switch layer is composed of the material having a composition represented by the composition formula (1), the atomic fraction x of the element C1 preferably satisfies $x \leq (3-(3+b) \times y - z)/(3+a)$. Further, the atomic fraction x of the element C1 is preferably set to 0.01 or more and 0.38 or less, the atomic fraction y of the element C2 is preferably set to 0.1 or more, and the atomic fraction z of the element A is preferably set to 0.1 or more. Further, when the element C1 includes at least one of Sc and Y, the atomic fraction x of the element C1 is preferably set to 0.01 or more and 0.38 or less. When the element C1 includes at least one of Hf and Zr, the atomic fraction x of the element C1 is preferably set to 0.01 or more and 0.32 or less.

When the chalcogen-containing layer 6 as the switch layer is composed of the material represented by the composition formula (2), the atomic fraction x of the element C1 preferably satisfies $x \leq (3-(3+b) \times y - z)/(3+a)$, and the atomic fraction w of N preferably satisfies $w \leq (a-(a-b) \times y - (a+2) \times z)/(3+a)$. Further, the atomic fraction x of the element C1 is preferably set to 0.01 or more and 0.38 or less, the atomic fraction y of the element C2 is preferably set to 0.1 or more, the atomic fraction z of the element A is preferably set to 0.1 or more, and the atomic fraction w of N is preferably set to 0.01 or more and 0.48 or less. Further, when the element C1 includes at least one of Sc and Y, the atomic fraction x of the element C1 is preferably set to 0.01 or more and 0.38 or less, and the atomic fraction w of nitrogen is preferably set to 0.01 or more and 0.43 or less. When the element C1 includes at least one of Hf and Zr, the atomic fraction x of the element C1 is preferably set to 0.01 or more and 0.32 or less, and the atomic fraction w of nitrogen is preferably set to 0.01 or more and 0.48 or less.

Note that while certain embodiments of the present invention have been described, these embodiments have been presented by way of example only, and are not intended to limit the scope of the inventions. The novel embodiments described herein may be embodied in a variety of other forms; furthermore, various omissions, substitutions, changes, and so on may be made therein without departing from the spirit of the inventions. The accompanying claims and their equivalents are intended to cover such forms or modifications as would fall within the scope and spirit of the inventions.

What is claimed is:

1. A resistance variable device, comprising:
   a first electrode;
   a second electrode; and
   a stack arranged between the first electrode and the second electrode and including a resistance variable layer and a chalcogen-containing layer, wherein
   the resistance variable layer constitutes a magnetoresistive random access memory,
   the chalcogen-containing layer which is a switch layer, contains a material having a composition represented by a general formula:

$C1_x C2_y A_z$ wherein C1 is at least one element selected from the group consisting of Zr and Hf, C2 is at least one element selected from the group consisting of C, Si, Ge, B, Al, Ga, and In, A is at least one element selected from the group consisting of S, Se, and Te, and x, y, and z are numbers representing atomic fractions satisfying $0<x<1$, $0<y<1$, $0<z<1$, and $x+y+z=1$, and when an oxidation number of the element C1 is set to a, and an oxidation number of the element C2 is set to b, the atomic fraction x of the element C1 satisfies $x\leq(3-(3+b)\times y-z)/(3+a)$, and the chalcogen-containing layer further contains N.

2. The device according to claim 1, wherein
x in the general formula is 0.01 or more and 0.32 or less, y in the general formula is 0.1 or more, and z in the general formula is 0.1 or more.

3. The device according to claim 1, wherein
the chalcogen-containing layer has an amorphous structure.

4. The device according to claim 1, wherein
the chalcogen-containing layer is configured to transit between a high-resistance state and a low-resistance state, and
the chalcogen-containing layer has an amorphous structure in both the high-resistance state and the low-resistance state.

5. The device according to claim 1, wherein
the C2 is at least one element selected from the group consisting of C, B, Ga, and In.

6. The device according to claim 1, wherein
the resistance variable layer includes a magnetoresistive random access memory layer, and
the chalcogen-containing layer is in contact with one of the first electrode or the second electrode, and in contact with the magnetoresistive random access memory layer.

7. A resistance variable device, comprising:
a first electrode;
a second electrode; and
a stack arranged between the first electrode and the second electrode and including a resistance variable layer and a chalcogen-containing layer, wherein
the resistance variable layer constitutes a magnetoresistive random access memory, and
the chalcogen-containing layer which is a switch layer, contains a material having a composition represented by a general formula:

$$C1_xC2_yA_zN_w$$

wherein C1 is at least one element selected from the group consisting of Sc, Y, Zr and Hf, C2 is at least one element selected from the group consisting of C, Si, Ge, B, Al, Ga, and In, A is at least one element selected from the group consisting of S, Se, and Te, and x, y, z, and w are numbers representing atomic fractions satisfying $0<x<1$, $0<y<1$, $0<z<1$, $0<w<1$, and $x+y+z+w=1$, and when an oxidation number of the element C1 is set to a, and an oxidation number of the element C2 is set to b, the atomic fraction x of the element C1 satisfies $x\leq(3-(3+b)\times y-z)/(3+a)$, and the atomic fraction w of N satisfies $w<(a-(a-b)\times y-(a+2)\times z)/(3+a)$.

8. The device according to claim 7, wherein
x in the general formula is 0.01 or more and 0.32 or less, y in the general formula is 0.1 or more, z in the general formula is 0.1 or more, and w in the general formula is 0.01 or more and 0.48 or less.

9. The device according to claim 7, wherein
the chalcogen-containing layer has an amorphous structure.

10. The device according to claim 7, wherein
the chalcogen-containing layer is configured to transit between a high-resistance state and a low-resistance state, and
the chalcogen-containing layer has an amorphous structure in both the high-resistance state and the low-resistance state.

11. The device according to claim 7, wherein
the C2 is at least one element selected from the group consisting of C, B, Ga, and In.

12. The device according to claim 7, wherein
the resistance variable layer includes a magnetoresistive random access memory layer, and
the chalcogen-containing layer is in contact with one of the first electrode or the second electrode, and in contact with the magnetoresistive random access memory layer.

13. A resistance variable device, comprising:
a first electrode;
a second electrode; and
a stack arranged between the first electrode and the second electrode and including a resistance variable layer and a chalcogen-containing layer, wherein
the resistance variable layer constitutes a magnetoresistive random access memory,
the chalcogen-containing layer which is a switch layer, contains at least one element C1 selected from the group consisting of Zr and Hf, at least one element C2 selected from the group consisting of C, Si, Ge, B, Al, Ga, and In, and at least one element A selected from the group consisting of S, Se, and Te, and
the chalcogen-containing layer further contains N.

14. The device according to claim 13, wherein
the chalcogen-containing layer has an amorphous structure.

15. The device according to claim 13, wherein
the chalcogen-containing layer is configured to transit between a high-resistance state and a low-resistance state, and
the chalcogen-containing layer has an amorphous structure in both the high-resistance state and the low-resistance state.

16. The device according to claim 13, wherein
the C2 is at least one element selected from the group consisting of C, B, Ga, and In.

17. The device according to claim 13, wherein
the resistance variable layer includes a magnetoresistive random access memory layer, and
the chalcogen-containing layer is in contact with one of the first electrode or the second electrode, and in contact with the magnetoresistive random access memory layer.

* * * * *